United States Patent
Kang et al.

(10) Patent No.: US 8,203,264 B2
(45) Date of Patent: Jun. 19, 2012

(54) FLAT PANEL DISPLAY AND METHOD OF FABRICATING THE SAME

(75) Inventors: Tae-Wook Kang, Suwon-si (KR);
Won-Kyu Kwak, Suwon-si (KR);
Jeong-Bai Choi, Suwon-si (KR);
Moon-Hee Park, Suwon-si (KR);
Dong-Young Sung, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 755 days.

(21) Appl. No.: 11/636,221

(22) Filed: Dec. 8, 2006

(65) Prior Publication Data

US 2007/0132365 A1   Jun. 14, 2007

(30) Foreign Application Priority Data

Dec. 9, 2005   (KR) .................... 10-2005-0120759
Dec. 15, 2005   (KR) .................... 10-2005-0123994

(51) Int. Cl.
*H01J 1/62* (2006.01)
*H01J 63/04* (2006.01)

(52) U.S. Cl. ........ 313/505; 313/494; 313/500; 313/503; 349/42; 349/43; 349/46; 438/34; 438/158; 438/642; 257/59; 257/72; 257/79; 257/80; 257/83

(58) Field of Classification Search .......... 313/498–512; 349/42, 43, 46, 106, 149–152; 438/30, 34, 438/155, 158, 642; 257/52, 59, 72, 79, 80, 257/83

See application file for complete search history.

(56) References Cited

U.S. PATENT DOCUMENTS

| | | | |
|---|---|---|---|
| 5,874,746 A * | 2/1999 | Holmberg et al. | 257/59 |
| 2002/0140895 A1* | 10/2002 | Kimura et al. | 349/187 |
| 2003/0017636 A1 | 1/2003 | Lay et al. | |
| 2003/0063229 A1* | 4/2003 | Takahashi et al. | 349/43 |
| 2003/0122140 A1* | 7/2003 | Yamazaki et al. | 257/88 |
| 2004/0134878 A1 | 7/2004 | Matsushita et al. | |
| 2004/0232421 A1* | 11/2004 | Ono et al. | 257/59 |
| 2005/0045882 A1* | 3/2005 | Park et al. | 257/59 |

(Continued)

FOREIGN PATENT DOCUMENTS

CN    1488976 A    4/2004

(Continued)

OTHER PUBLICATIONS

Korean Patent Abstracts, Publication No. 1020030053673 A, dated Jul. 2, 2003, in the name of Byeong Hyeon Jung et al.

(Continued)

*Primary Examiner* — Peter J Macchiarolo
*Assistant Examiner* — Thomas A Hollweg
(74) *Attorney, Agent, or Firm* — Christie, Parker & Hale, LLP

(57) ABSTRACT

A flat panel display and a method of fabricating the same are provided. The flat panel display includes a conductor, and a passivation layer pattern disposed on a side end of the conductor. As such, the passivation layer pattern can prevent or reduce corrosion and damage of the conductor. In one embodiment, the conductor includes a conductive layer formed of a material selected from the group consisting of aluminum and an aluminum alloy. The passivation layer pattern may be formed of an organic material or an inorganic material.

10 Claims, 6 Drawing Sheets

U.S. PATENT DOCUMENTS

| | | | |
|---|---|---|---|
| 2006/0022592 A1* | 2/2006 | Boroson | 313/512 |
| 2006/0175286 A1* | 8/2006 | Matsushita et al. | 216/23 |

FOREIGN PATENT DOCUMENTS

| | | |
|---|---|---|
| GB | 2 396 733 A | 6/2004 |
| JP | 52-070751 | 6/1977 |
| JP | 57-061243 | 4/1982 |
| JP | 60-181776 | 9/1985 |
| JP | 05-281577 | 10/1993 |
| JP | 11-119694 | 4/1999 |
| JP | 2000-131719 | 5/2000 |
| JP | 2000-243834 | 9/2000 |
| JP | 2001-068680 | 3/2001 |
| JP | 2001-174794 | 6/2001 |
| JP | 2001-194676 | 7/2001 |
| JP | 2001-230085 | 8/2001 |
| JP | 2002-341367 | 11/2002 |
| JP | 2003-133078 | 5/2003 |
| JP | 2003-255859 | 9/2003 |
| JP | 2004-071920 | 3/2004 |
| JP | 2004-111361 | 4/2004 |
| JP | 2004-158826 | 6/2004 |
| JP | 2005-031251 | 2/2005 |
| JP | 2005-123610 | 5/2005 |
| JP | 2005-327745 | 11/2005 |
| KR | 1995-0034440 | 12/1995 |
| KR | 2003-0053673 | 7/2003 |
| KR | 10-2004-0017637 | 2/2004 |
| KR | 10-2004-0025093 | 3/2004 |
| KR | 10-0441434 | 7/2004 |

OTHER PUBLICATIONS

Korean Patent Abstracts, Publication No. 1020040017637 A, dated Feb. 27, 2004, in the name of Dong Hun Lee et al.

Korean Patent Abstracts, Publication No. 1020040025093 A, dated Mar. 24, 2004, in the name of Chang Su Seo.

China Office action dated Apr. 4, 2008, for corresponding Chinese Patent application 200610162075.5, with English translation indicating relevance of reference listed in this IDS.

Japanese Office action dated Aug. 4, 2009, for corresponding Japanese application 2006-333513, noting listed references in this IDS.

Patent Abstracts of Japan, Publication No. 2000-243834, Published on Sep. 8, 2000, in the name of Kitawada, et al.

Patent Abstracts of Japan, Publication No. 2004-158826, Published on Jun. 3, 2004, in the name of Ishida.

Korean Patent Abstracts, Publication No. 1020030012559 A, Published on Feb. 12, 2003, in the name of Lee, Corresponding to KR Application No. 10-2001-0046633.

European Search Report dated Sep. 22, 2010, for corresponding European Patent application 06256263.2, noting listed references in this IDS.

* cited by examiner

FLAT PANEL DISPLAY AND METHOD OF FABRICATING THE SAME

CROSS-REFERENCE TO RELATED APPLICATION

This application claims priority to and the benefit of Korean Patent Application No. 10-2005-120759, filed Dec. 9, 2005, and Korean Patent Application No. 10-2005-123994, filed Dec. 15, 2005, in the Korean Intellectual Property Office, the entire contents of which are incorporated herein by reference.

BACKGROUND OF THE INVENTION

1. Field of the Invention

The present invention relates to a flat panel display and a method of fabricating the same.

2. Description of the Related Art

Flat panel displays such as a liquid crystal display, an organic light emitting display, an inorganic light emitting display, etc., use aluminum-group metals to reduce interconnection resistance.

Aluminum-group metal conductors may be readily damaged by an etching solution during a manufacturing process.

SUMMARY OF THE INVENTION

Aspects of the present invention provide a flat panel display and a method of fabricating the same capable of preventing (or blocking) a conductor such as an electrode, an interconnection, or the like, from being corroded or etched during a manufacturing process. More specifically, an aspect of the present invention provides a flat panel display and a method of fabricating the same capable of preventing (or reducing) corrosion and damage of a conductor including an interconnection.

In a first exemplary embodiment of the present invention, a flat panel display includes: a conductor; and a passivation layer pattern disposed on a side end of the conductor.

In a second exemplary embodiment of the present invention, a flat panel display includes: an organic light emitting diode including a first electrode, a second electrode, and an organic layer interposed between the first electrode and the second electrode, the organic layer having an emission layer; an interconnection electrically connected to the organic light emitting diode; and a passivation layer pattern disposed on a side end of the interconnection.

In a third exemplary embodiment of the present invention, a flat panel display includes: an active layer; a gate electrode insulated from the active layer; a source electrode insulated from the gate electrode and electrically connected to the active layer; a drain electrode insulated from the gate electrode and electrically connected to the active layer; and a passivation layer pattern disposed on a side end of at least one of the gate electrode, the source electrode, or the drain electrode.

In a fourth exemplary embodiment of the present invention, a flat panel display includes: a thin film transistor on a substrate and having a source electrode and a drain electrode; an interconnection disposed on the substrate in a non-emission region of the substrate and electrically connected to the thin film transistor; a passivation layer pattern disposed on a planarization layer and exposing a portion of at least one of the source electrode or the drain electrode, the passivation layer pattern being further disposed on a side end of the interconnection; and an organic light emitting diode electrically connected to the thin film transistor.

In a fifth exemplary embodiment of the present invention, a method of fabricating a flat panel display is provided. The method includes: forming a thin film transistor having a source electrode and a drain electrode on a substrate; forming an interconnection on the substrate and in a non-emission region of the substrate, the interconnection being electrically connected to the thin film transistor on the substrate; forming a planarization layer on the substrate to cover at least the thin film transistor and the interconnection; patterning the planarization layer to form a via hole exposing a portion of the source electrode or the drain electrode, and a passivation layer pattern disposed on a side end of the interconnection; and forming an organic light emitting diode electrically connected to the source electrode and the drain electrode.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

Figure 1:
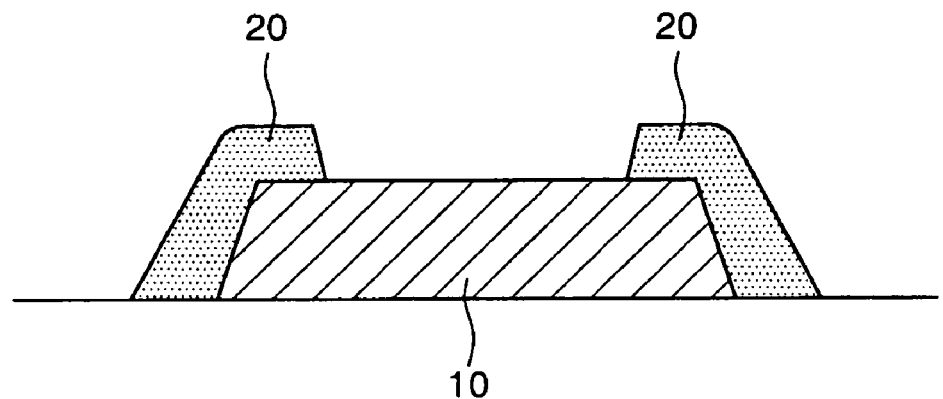
FIG. 1 is a cross-sectional view of a conductor included in a flat panel display in accordance with an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a cross-sectional view of a conductor 10 included in a flat panel display in accordance with an exemplary embodiment of the present invention.

The conductor 10 may be a data interconnection, a scan interconnection, a power interconnection, and/or a bus interconnection for reducing (or preventing) a voltage drop thereof. Here, the conductor 10 is used in a flat panel display, or in an electrode of a thin film transistor or a capacitor, as described in more detail below. The conductor 10 may include a metal material such as Ag, Mg, Al, Pt, Pd, Au, Ni, Nd, Ir, Cr, Li, Ca, or combinations thereof, and/or a transparent conductive material such as ITO, IZO, ZnO, $In_2O_3$, or combinations thereof. In addition, a conductive paste including a conductive organic material and/or conductive particles such as Ag, Mg, Cu, etc., may be used.

Side surfaces of the conductor 10 are surrounded by a passivation layer pattern 20. The passivation layer pattern 20 is formed of an insulating material to surround the conductor 10, thereby protecting the conductor 10 from an etching solution, etchant, etc., that may permeate to the side surfaces of the conductor 10.

The passivation layer pattern 20 may be formed of an organic material, which includes at least one selected from the group consisting of polymer derivatives having a phenol group, an acryl-based polymer, an imide-based polymer, an arylether-based polymer, an amide-based polymer, a fluorine-based polymer, a p-silirene-based polymer, a vinyl alcohol-based polymer, and combinations thereof. In one embodiment, the passivation layer pattern 20 is formed of an acryl-based material. In one embodiment, the acryl-based material is a photosensitive acryl-based material, thereby facilitating formation of a pattern.

The passivation layer pattern 20 may be formed of an inorganic material, which includes at least one selected from the group consisting of $SiO_2$, $SiN_x$, SiON, $Al_2O_3$, $TiO_2$, $Ta_2O_3$, $HfO_2$, $ZrO_2$, BST, PZT, and combinations thereof.

Figure 2:
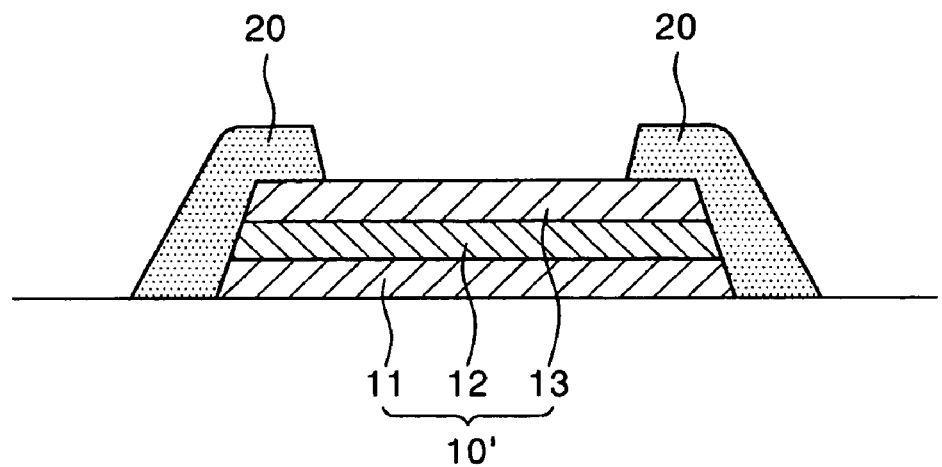
FIG. 2 is a cross-sectional view of a conductor included in a flat panel display in accordance with another exemplary embodiment of the present invention.

Also, as shown in FIG. 2, a conductor 10' according to another exemplary embodiment of the present invention is formed to have a multi-layered structure including aluminum or an aluminum alloy.

As shown in FIG. 2, the conductor 10' includes a first conductive layer 11, a second conductive layer 12, and a third conductive layer 13, which are deposited adjacent to one another (or sequentially deposited). Here, the second conductive layer 12 may be formed of aluminum or an aluminum alloy, for example, Al, AlSi, AlNd, AlCu, etc.

When the second conductive layer 12 is formed of an aluminum-group metal, at least one of the first and third conductive layers 11 and 13 may include at least one selected from the group consisting of Cr, a Cr alloy, Mo, a Mo alloy, W, and a W alloy.

As an example, the first and third conductive layers 11 and 13 may be formed of MoW, and the second conductive layer 12 may be formed of AlNd. However, the present invention is not thereby limited.

Also, when the second conductive layer 12 is formed of an aluminum-group metal, at least one of the first and third conductive layers 11 and 13 may include at least one selected from the group consisting of Ti, a Ti alloy, Ta, and a Ta alloy.

As an example, the first and third conductive layers 11 and 13 may be formed of a Ti-group metal, and the second conductive layer 12 may be formed of an Al-group metal.

However, the present invention is not thereby limited, and a separate layer may be added to form a multi-layered structure, in addition to the three-layered structure.

Even in the case of the conductor 10' with the multi-layered structure, a passivation layer pattern 20 may be formed of an insulating material to cover a side end of the conductor 10'. The passivation layer pattern 20 may be formed of the above-mentioned materials. That is, when the passivation layer pattern 20 is formed of an organic material, the organic material may include at least one selected from the group consisting of polymer derivatives having a phenol group, an acryl-based polymer, an imide-based polymer, an arylether-based polymer, an amide-based polymer, a fluorine-based polymer, a p-silirene-based polymer, a vinyl alcohol-based polymer, and combinations thereof. In one embodiment, the passivation layer pattern 20 is formed of an acryl-based material. In one embodiment, the acryl-based material is a photosensitive acryl-based material, thereby facilitating formation of a pattern. When the passivation layer pattern 20 is formed of an inorganic material, the inorganic material may include at least one selected from the group consisting of $SiO_2$, $SiN_x$, SiON, $Al_2O_3$, $TiO_2$, $Ta_2O_3$, $HfO_2$, $ZrO_2$, BST, PZT, and combinations thereof.

As described above, as the conductor 10' is formed in a multi-layered structure, it is possible to improve conductivity of the conductor 10 due to the second conductive layer 12 being in the aluminum-group having a relatively high conductivity, and to protect the second conductive layer 12 using the first and third conductive layers 11 and 13. In addition, it is possible to prevent (or reduce) corrosion and etching of the aluminum-group second conductive layer 12 due to penetration of etchant, etc., using the passivation layer pattern 20 formed on side surfaces of the second conductive layer 12.

The above structure can be used in various regions such as outer sides of a pixel and an emission region of a flat panel display.

Figure 3:
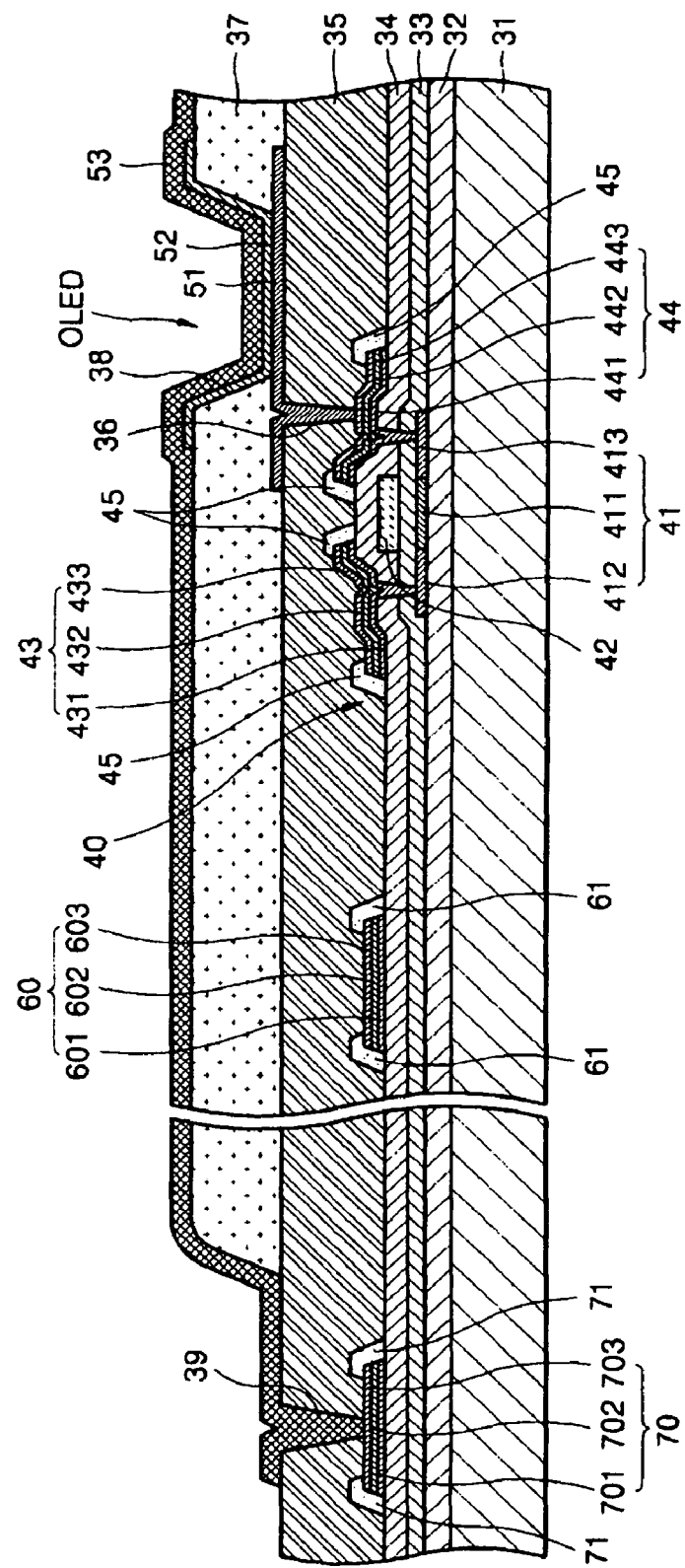
FIG. 3 is a cross-sectional view of an organic light emitting display in accordance with an exemplary embodiment of the present invention.

FIG. 3 is a cross-sectional view of an organic light emitting display in accordance with an exemplary embodiment of the present invention.

As shown in FIG. 3, a thin film transistor (TFT) 40 and an organic light emitting diode (OLED) are disposed on a substrate 31.

The substrate 31 may be formed of a plastic material such as acryl, polyimide, polycarbonate, polyester, mylar, etc. However, the present invention is not thereby limited. For example, the substrate may be formed of a metal foil such as SUS or tungsten, or a glass material.

An insulating layer 32 such as a barrier layer and/or a buffer layer may be formed on the substrate 31 to prevent (or reduce) diffusion of impurity ions and penetration of moisture or external air, and to planarize a surface thereof.

An active layer 41 of the thin film transistor 40 is formed on the insulating layer 32 using a semiconductor material, and a gate insulating layer 33 is formed to cover the active layer 41. The active layer 41 may be formed of an inorganic semiconductor such as amorphous silicon or polysilicon, or an organic semiconductor, and includes a source region 412, a drain region 413, and a channel region 411 disposed therebetween.

A gate electrode 42 is disposed on the gate insulating layer 33, and an interlayer insulating layer 34 is formed to cover the gate electrode 42. In addition, a source electrode 43 and a drain electrode 44 are disposed on the interlayer insulating layer 34, and then a passivation layer (or a passivation layer pattern) 35 is disposed to cover the source and drain electrodes 43 and 44.

The gate insulating layer 33, the interlayer insulating layer 34, and the passivation layer 35 may be formed of an insulating material of a single-layered or multi-layered structure, and formed of an organic material, an inorganic material, or an organic/inorganic compound.

The deposition structure of the above thin film transistor 40 is not thereby limited thereto, and various other suitable structures may be employed.

As also shown in FIG. 3, a first electrode 51 which is an electrode of the organic light emitting diode OLED is formed on the passivation layer 35, and a pixel-defining layer 37 is formed thereon. An opening 38 is formed in the pixel-defining layer 37 to expose the first electrode 51, and then an organic layer 52 of the organic light emitting diode OLED is formed.

The organic light emitting diode OLED emits light of red, green, and blue depending on current flow to display an image information. Here, the organic light emitting diode OLED includes the first electrode 51 in contact with a drain electrode 44 of the thin film transistor 40 through a via-hole 36, a second electrode 53 for covering the entire pixel, and an organic layer 52 having an emission layer disposed between the first electrode 51 and the second electrode 53 to emit light.

The first electrode 51 and the second electrode 53 are insulated from each other by the organic layer 52, and different polarities of voltages are applied to the organic layer 52 to emit light from the organic layer 52.

The organic layer 52 may use a low molecular organic layer or a polymer organic layer. When the low molecular organic layer is used, a hole injection layer (HIL), a hole transport layer (HTL), an emission layer (EML), an electron transport layer (ETL), an electron injection layer (EIL), etc., may be deposited in a single or multi-layered structure. In addition, various organic materials such as copper phthalocyanine (CuPc), N,N-Di(naphthalene-1-yl)-N,N'-diphenyl-benzidine (NPB), tris-8-hydroxyquinoline aluminum (Alq3), or the like, may be employed. The low molecular organic layer may be formed by a vacuum deposition method. Here, the hole injection layer, the hole transport layer, the electron transport layer, and the electron injection layer may be applied to red, green and blue pixels in common as common layers. Therefore, unlike the embodiment shown in FIG. 3, the common layers according to one embodiment may be formed to cover the entire pixels, similar to the second electrode 53.

The polymer organic layer may have a structure including a hole transport layer (HTL) and an emission layer (EML). Here, the hole transport layer may be formed of PEDOT, and the emission layer may be formed of a poly-phenylenevinylene(PPV)-based or polyfluorene-based polymer organic material. The hole transport layer and the emission layer may be formed by a screen printing method, an inkjet printing method, or the like.

The organic layer of the present invention, however, is not thereby limited to the organic layer shown in FIG. 3.

In FIG. 3, the first electrode 51 functions as an anode electrode, and the second electrode 53 functions as a cathode electrode. Alternatively, the first electrode 51 may function as a cathode electrode, and the second electrode 53 may function as the anode electrode.

If the organic light emitting display of FIG. 3 is a bottom emission type, then the first electrode 51 may be a transparent electrode, and the second electrode 53 may be a reflective electrode. Here, the transparent electrode as the first electrode 51 may be formed of ITO, IZO, $In_2O_3$, ZnO, or the like, having a relatively high work function, and the reflective electrode as the second electrode 53 may be formed of a metal material such as Ag, Mg, Al, Pt, Pd, Au, Ni, Nd, Ir, Cr, Li, Ca, or compounds thereof.

If the organic light emitting display of FIG. 3 is a top emission type, then the first electrode 51 may be a reflective electrode, and the second electrode 53 may be a transparent electrode. Here, the reflective electrode as the first electrode 51 may be made by forming a reflective layer using Ag, Mg, Al, Pt, Pd, Au, Ni, Nd, Ir, Cr, Li, Ca, or combinations thereof, and then forming a layer using ITO, IZO, $In_2O_3$, ZnO, or the like, having a relatively high work function. In addition, the transparent electrode as the second electrode 53 may be made by depositing a metal having a relatively low work function such as Ag, Mg, Al, Pt, Pd, Au, Ni, Nd, Ir, Cr, Li, Ca, or combinations thereof, and then forming an auxiliary electrode layer or a bus electrode line using a transparent conductive material such as ITO, IZO, $In_2O_3$, ZnO, or the like.

If the organic light emitting display of FIG. 3 is a dual emission type, both the first and second electrodes 51 and 53 may be formed as transparent electrodes.

The first and second electrodes 51 and 53 are not limited to the above described materials, and may be formed of a conductive organic material, or a conductive paste including conductive particles such as Ag, Mg, Cu, or the like, in addition to the above described materials. When the conductive paste is used, the electrodes 51 and 53 may be printed by an inkjet printing method, and then may be plasticized.

After forming the organic light emitting diode OLED, an upper part thereof is sealed (or hermetically sealed) to block the organic light emitting diode OLED from external air.

In addition, the gate electrode 42, the source electrode 43, and the drain electrode 44 may include a metal material such as Ag, Mg, Al, Pt, Pd, Au, Ni, Nd, Ir, Cr, Li, Ca or combinations thereof, or a transparent conductive material such as ITO, IZO, $In_2O_3$, ZnO, or the like. In addition, a conductive organic material, or a conductive paste including conductive particles such as Ag, Mg, Cu, or the like, may be used.

In addition, the electrodes may be formed in a three-layered structure, as shown in FIG. 2.

According to an exemplary embodiment of the present invention as shown in FIG. 3, the gate electrode 42 has a single layered structure, and the source electrode 43 and the drain electrode 44 have a three-layered structure; but the present invention is not thereby limited. For example, various suitable combinations of the above structures may be used as the electrodes. Hereinafter, as shown in FIG. 3, the structure in which the gate electrode 42 has a single layered structure, and the source electrode 43 and the drain electrode 44 have a three-layered structure will be described in more detail.

The source electrode 43 and the drain electrode 44 may include a structure in which first conductive layers 431 and 441, second conductive layers 432 and 442, and third conductive layers 433 and 443 are sequentially deposited from a lower side of FIG. 3. Here, the second conductive layers 432 and 442 may be formed of aluminum or an aluminum alloy, for example, Al, AlSi, AlNd, AlCu, or the like.

When the second conductive layers 432 and 442 are formed of an aluminum-group metal, as described above, at least one of the first conductive layers 431 and 441 or the third conductive layers 433 and 443 may include at least one selected from the group consisting of Cr, a Cr alloy, Mo, a Mo alloy, W, and a W alloy.

For example, the first conductive layers 431 and 441 and the third conductive layers 433 and 443 may be formed of MoW, and the second conductive layers 432 and 442 may be formed of AlNd, similar to the conductor of FIG. 2.

When the second conductive layers 432 and 442 are formed of an aluminum-group metal, at least one of the first conductive layers 431 and 441 or the third conductive layers 433 and 443 may include at least one selected from the group consisting of Ti, a Ti alloy, Ta, and a Ta alloy.

For example, the first conductive layers 431 and 441 and the third conductive layers 433 and 443 may be formed of a Ti-based metal, and the second conductive layers 432 and 442 may be formed of an Al-based metal.

However, the present invention is not thereby limited thereto, and a separate layer structure may be added to the three-layered structure.

Even in the case of the source electrode 43 and the drain electrode 44 having the multi-layered structure, a passivation layer pattern 45 may be formed to cover side ends of the source electrode 43 and the drain electrode 44 using an insulating material. The passivation layer pattern 45 may be formed of the above-mentioned material. That is, when the passivation layer pattern 45 is formed of an organic material, the organic material may be formed of at least one selected from the group consisting of polymer derivatives having a phenol group, an acryl-based polymer, an imide-based polymer, an arylether-based polymer, an amide-based polymer, a fluorine-based polymer, a p-silirene-based polymer, a vinyl alcohol-based polymer, and combinations thereof. In one embodiment, the passivation layer pattern 45 is formed of an acryl-based material. In one embodiment, the acryl-based material is a photosensitive acryl-based material, thereby facilitating formation of a pattern. When the passivation layer pattern 45 is formed of an inorganic material, the inorganic material may be formed of at least one selected from the group consisting of $SiO_2$, $SiN_x$, $SiON$, $Al_2O_3$, $TiO_2$, $Ta_2O_3$, $HfO_2$, $ZrO_2$, BST, PZT, and combinations thereof.

As described above, as the source electrode 43 and the drain source 44 are formed in a multi-layered structure, it is possible to improve conductivity of the source electrode 43 and the drain source 44 due to the second conductive layers 432 and 442 being in the aluminum-group having a relatively high conductivity, and to protect the second conductive layers 432 and 442 using the first conductive layers 431 and 441 and the third conductive layers 433 and 443. In addition, it is possible to prevent (or reduce) corrosion and etching of the aluminum-group second conductive layers 432 and 442 due to penetration of etchant, etc., using the passivation layer pattern 45 formed on the side surfaces of the second conductive layers 432 and 442. Especially, when the first electrode 51 is patterned, it is more advantageous to protect the source electrode 43 and the drain electrode 44 from penetration of the etchant.

In addition, when the source and drain electrodes 43 and 44 are formed, an interconnection 60 may be further formed. The interconnection 60 may be a Vdd power line, but is not limited thereto, and various suitable interconnections can be adapted to a pixel circuit of an organic light emitting display. The interconnection 60, formed together with the source electrode 43 and the drain electrode 44, also has a first conductive layer 601, a second conductive layer 602, and a third conductive layer 603. The first, second and third conductive layers 601, 602 and 603 may be formed of the same materials as the above described conductive layer materials.

Even in the case of the interconnection 60, a passivation layer pattern 61 may be formed as described above. That is, since the passivation layer pattern 61 is formed to be substantially the same as the source and drain electrodes 43 and 44 are formed, a detailed description thereof will not be provided.

When the source and drain electrodes 43 and 44 are formed, various conductors including the interconnection 60 in the pixel may be formed. For example, as shown in FIG. 3, a bus line 70 may be disposed in contact with the second electrode 53. The bus line 70, formed together with the source and drain electrodes 43 and 44, also has a first conductive layer 701, a second conductive layer 702, and a third conductive layer 703. The first, second and third conductive layers 701, 702 and 703 may be formed of the same materials as the above described conductive layer materials. The bus line 70 is in contact with the second electrode 53 through a via-hole 39 formed in the passivation layer 35 to allow power to be supplied to the second electrode 53.

Even in the case of the bus line 70, a passivation layer pattern 71 may be formed in substantially the same manner as described above. That is, since the passivation layer pattern 71 is formed in a manner substantially the same as the source and drain electrodes 43 and 44 are formed, a detailed description thereof will not be provided.

Although the passivation layer pattern can have a structure covering a side end of the conductor, the present invention is not thereby limited. Alternatively, the passivation layer pattern may have a structure covering the entire conductor.

As described above, a passivation layer pattern of an embodiment of the present invention may be applied to various conductive structures of a flat panel display. That is, while the above embodiments are described with respect to an organic light emitting display, these embodiments may also be employed in various other suitable flat panel displays such as a liquid crystal display, etc., in addition to the organic light emitting display.

FIGS. 4A to 4D are cross-sectional views illustrating a method of fabricating an organic light emitting display in accordance with an exemplary embodiment of the present invention.

Figure 4A:
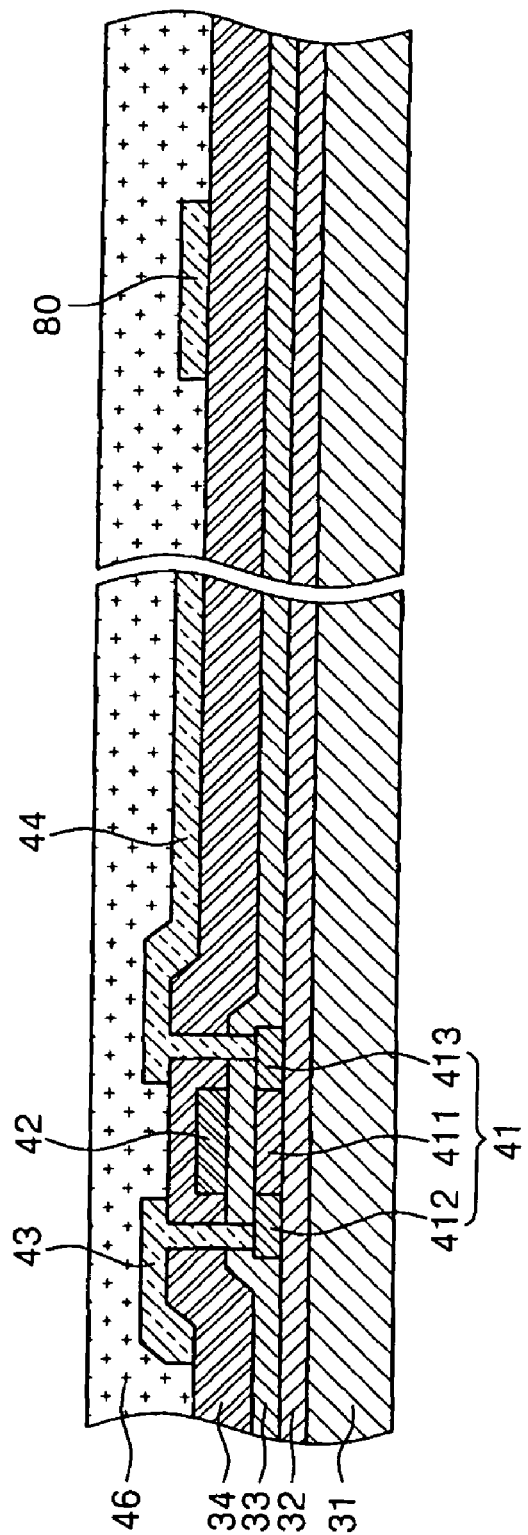
FIGS. 4A, 4B, 4C, and 4D are cross-sectional views illustrating a method of fabricating an organic light emitting display in accordance with an exemplary embodiment of the present invention.

Referring to FIG. 4A, an insulating layer 32 is formed on a substrate 31 to prevent (or block) diffusion of impurities such as metal ions from the substrate 31 and penetration into an active layer 41.

After forming the insulating layer 32, amorphous silicon is deposited and crystallized on the insulating layer 32 to form a polysilicon layer, and then the polysilicon layer is patterned to form the active layer 41.

Then, a gate insulating layer 33 is deposited on the entire surface of the substrate including the active layer 41, and a gate metal is deposited on the gate insulating layer 33 and patterned to form a gate electrode 42.

After forming the gate electrode 42, impurities of a predetermined conductivity type are doped into the active layer 41 using the gate electrode 42 as a mask to form source and drain regions 412 and 413. A region between the source and drain regions 412 and 413, on which impurities are not doped, functions as a channel region 411 of a thin film transistor.

After forming the source and drain regions 412 and 413 in the active layer 41, an interlayer insulating layer 34 is formed on the entire surface of the substrate, including the active layer 41, and contact holes are formed to expose a portion of the source and drain regions 412 and 413 in the interlayer insulating layer 34.

A conductive material is deposited on the interlayer insulating layer 34 including the contact holes, and then patterned to form source and drain electrodes 43 and 44 connected to the source and drain regions 412 and 413 through the contact holes, thereby completing the thin film transistor including the active layer 41, the gate electrode 42, and the source and drain electrodes 43 and 44.

While the source and drain electrodes 43 and 44 are formed, an interconnection 80 is simultaneously formed in a non-emission region of the substrate 31 to electrically connect an external circuit module and the thin film transistor. That is, the interconnection 80 is electrically connected to the TFT and the external circuit module.

Here, to improve corrosion resistance of the interconnection 80 against external environment, the source and drain electrodes 43 and 44 and the interconnection 80 may be formed of a material selected from the group consisting of Ti/Al, Ti/Al alloy (AlSi, AlNd, and equivalent thereof), Ti/Al/Ti, Ti/TiN/Al/TiN/Ti, Ti/TiN/AlSi/TiN/Ti, and Ti/Al alloy/Ti.

After forming the source and drain electrodes 43 and 44 and the interconnection 80, a planarization layer 46 is formed on the substrate including the source and drain electrodes 43 and 44 and the interconnection 80 to complete a TFT panel. Here, the planarization layer 46 may be formed of a material selected from the group consisting of acryl, polyimide (PI), benzocyclobutene (BCB), silicate-on-glass (SOG), and equivalents thereof, to remove a step of a lower structure. In addition, the planarization layer 46 may be formed by spin-coating and/or slit-coating the material.

Figure 4B:
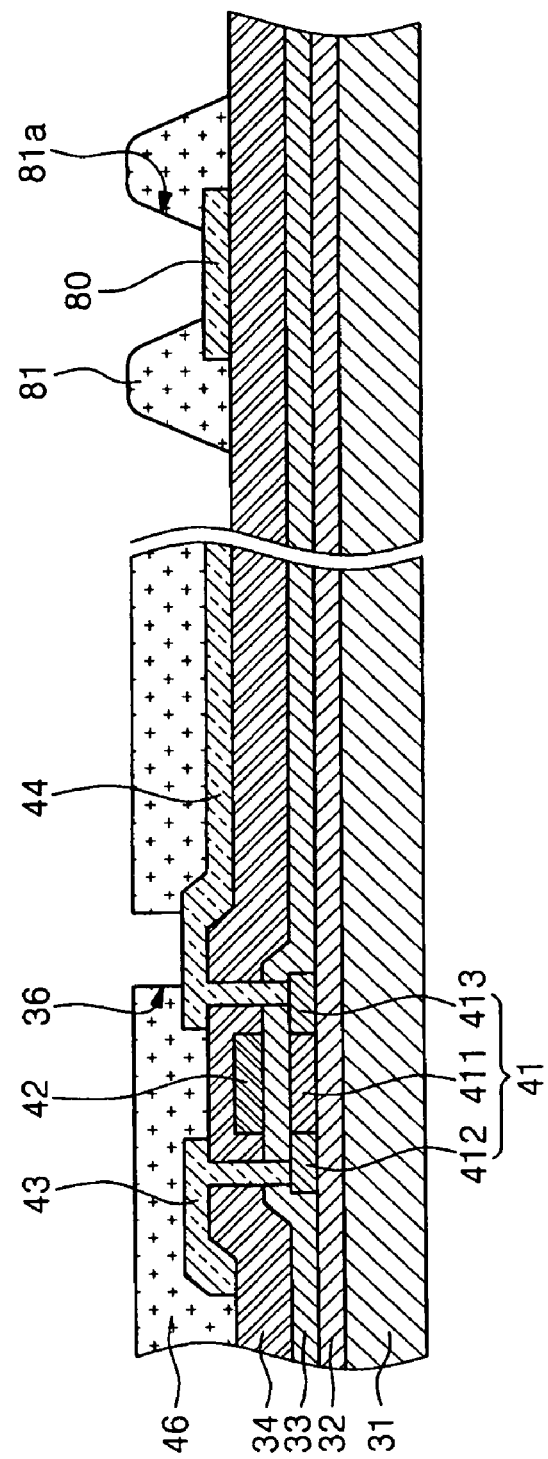

Referring to FIG. 4B, the planarization layer 46 is formed, and then patterned to form a via-hole 36 exposing a portion of one of the source and drain electrodes 43 and 44, for example, the drain electrode 44. Here, while the via-hole 36 is formed, a passivation layer pattern 81 having an opening 81a exposing a portion of the interconnection 80 and disposed on a side end of the interconnection 80 is simultaneously formed.

Figure 4C:
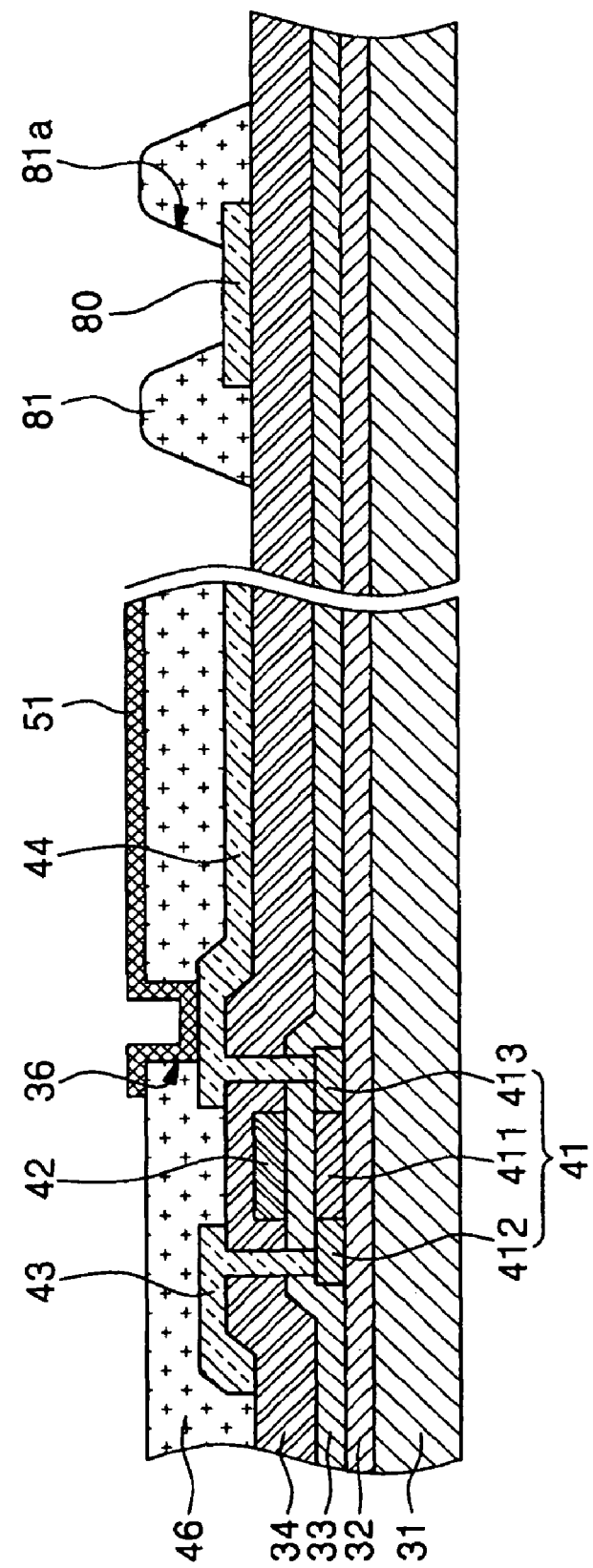

Referring to FIG. 4C, after forming the via-hole 36 and the passivation layer pattern 81, a first electrode 51 electrically connected to one of the source and drain electrodes 43 and 44, for example, the drain electrode 44 through the via-hole 36, is formed.

In FIG. 4C, the first electrode 51 may be formed of a transparent or semi-transparent conductive layer. In one embodiment, the first electrode 51 may include one or more layers formed by a material selected from the group consisting of ITO, IZO, ITZO, and equivalents thereof, i.e., metal oxide having indium. For example, the first electrode 51 may include a structure having ITO(or IZO, ITZO)/Al(or Al alloy), ITO(or IZO, ITZO)/Al(or Al alloy)/ITO(or IZO, ITZO), or the like.

Figure 4D:
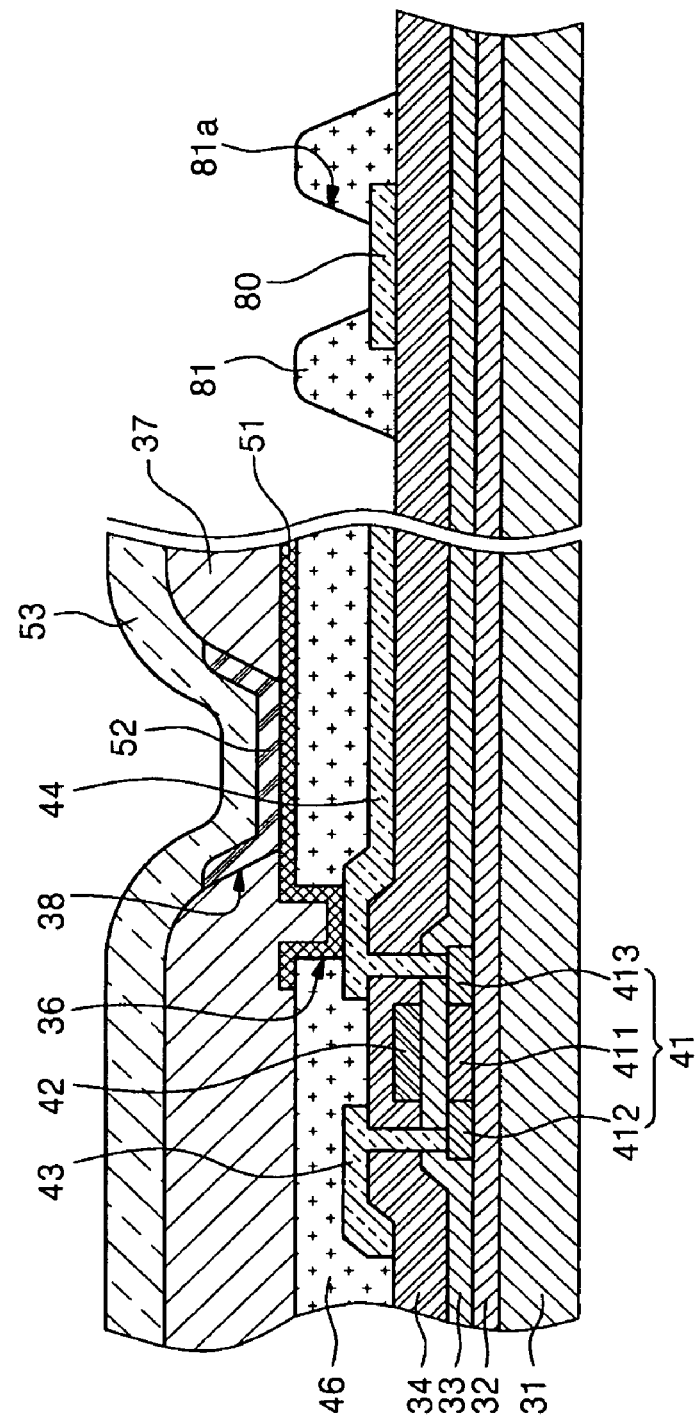

Referring to FIG. 4D, after forming the first electrode 51, a pixel-defining layer 37 is deposited on the entire surface of the substrate including the first electrode 51 and patterned to form an opening 38 exposing a portion of the first electrode 51. Here, the pixel-defining layer 37 disposed in a non-emission region of the substrate 31 is also removed.

Then, an organic layer 52 including an emission layer is formed on the pixel-defining layer 37 including the opening 38.

The organic layer 52 may be composed of various layers according to its function. In one embodiment, the organic layers include a hole injection layer (HIL), a hole transport layer (HTL), an emission layer (EML), a hole blocking layer (HBL), an electron transport layer (ETL), and/or an electron injection layer (EIL), in addition to the emission layer.

In addition, in an embodiment of the present invention, the organic layer 52 is formed of forming a hole injection layer (HIL), a hole transport layer (HTL), and so on, forming an emission layer (EML) in the opening, and then forming a hole blocking layer (HBL), an electron transport layer (ETL), and an electron injection layer (EIL).

After forming the organic layer 52, a second electrode 53 is formed on the organic layer 52 to complete an organic light emitting diode including the first electrode 51, the organic layer 52, and the second electrode 53.

An encapsulation substrate can then be mounted on the organic light emitting diode to encapsulate the substrate 31, on which the TFT and the organic light emitting diode are formed, using sealant, and then the metal interconnection 80 is electrically connected to an external circuit module, thereby completing the organic light emitting display according to the exemplary embodiment of the present invention.

An organic light emitting display in accordance with an exemplary embodiment of the present invention includes the source and drain electrodes 43 and 44 and the interconnection 80 formed of at least one selected from the group consisting of Ti/Al, Ti/Al alloy(AlSi, AlNd, and equivalent thereof), Ti/Al/Ti, Ti/TiN/Al/TiN/Ti, Ti/TiN/AlSi/TiN/Ti, and Ti/Al alloy/Ti, thereby improving corrosion resistance of the metal interconnection 80 against external environment.

In addition, the first electrode 51 is generally formed by patterning through wet etching. Since the interconnection 80 is formed by the deposition layer as described above and a side end of the interconnection 80 is protected by the passivation layer pattern 81, it is possible to prevent (or reduce) damage of the interconnection 80 caused by the wet etching.

In addition, it is possible to reduce an outgassing effect and increase the lifespan of the organic light emitting diode by removing a portion of the planarization layer 46.

In view of the foregoing, an embodiment of the present invention provides an organic light emitting display and a method of fabricating the same capable of improving corrosion resistance of a metal interconnection in a non-emission region of a TFT panel.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A flat panel display comprising:
    a plurality of conductors comprising at least a source electrode and a drain electrode;
    a passivation layer pattern covering a side end and a partial top portion of each of the plurality of conductors and exposing a portion of each of the plurality of conductors; and
    a passivation layer contacting both the passivation layer pattern and the exposed portion of each of the plurality of conductors, the passivation layer contacting an entire top surface of the passivation layer pattern, wherein
    the area of each of the plurality of conductors that the passivation layer contacts is greater than the area of each of the plurality of conductors that the passivation layer pattern covers.

2. The flat panel display according to claim 1, wherein each of the plurality of conductors comprises a conductive layer formed by a material selected from the group consisting of aluminum and an aluminum alloy.

3. The flat panel display according to claim 2, wherein each of the plurality of conductors comprises a first conductive layer, a second conductive layer, and a third conductive layer, wherein the second conductive layer is deposited between the first conductive layer and the third conductive layer, and wherein the second conductive layer is formed by a material selected from the group consisting of aluminum and an aluminum alloy.

4. The flat panel display according to claim 3, wherein at least one of the first layer or the third conductive layer comprises at least one selected from the group consisting of Cr, a Cr alloy, Mo, a Mo alloy, W, and a W alloy.

5. The flat panel display according to claim 3, wherein at least one of the first layer or the third conductive layer comprises a material selected from the group consisting of Ti, a Ti alloy, Ta, and a Ta alloy.

6. The flat panel display according to claim 1, wherein the passivation layer pattern is formed of an organic material.

7. The flat panel display according to claim 6, wherein the passivation layer pattern is formed by a material selected from the group consisting of polymer derivatives having a phenol group, an acryl-based polymer, an imide-based polymer, an arylether-based polymer, an amide-based polymer, a fluorine-based polymer, a p-silirene-based polymer, a vinyl alcohol-based polymer, and combinations thereof.

8. The flat panel display according to claim 1, wherein the passivation layer pattern is formed of an inorganic material.

9. The flat panel display according to claim 8, wherein the passivation layer pattern is formed by a material selected from the group consisting of $SiO_2$, $SiN_x$, SiON, $Al_2O_3$, $TiO_2$, $Ta_2O_3$, $HfO_2$, $ZrO_2$, BST, and PZT.

10. The flat panel display according to claim 1, further comprising:

an interlayer insulating layer beneath the plurality of conductors;

a gate insulating layer beneath the interlayer insulating layer;

a gate electrode between the interlayer insulating layer and the gate insulating layer;

an insulating layer beneath the gate insulating layer; and a semiconductor between the gate insulating layer and the insulating layer.

* * * * *

UNITED STATES PATENT AND TRADEMARK OFFICE
CERTIFICATE OF CORRECTION

| | | |
|---|---|---|
| PATENT NO. | : 8,203,264 B2 | |
| APPLICATION NO. | : 11/636221 | |
| DATED | : June 19, 2012 | |
| INVENTOR(S) | : Tae-Wook Kang et al. | |

It is certified that error appears in the above-identified patent and that said Letters Patent is hereby corrected as shown below:

In the Claims

Column 10, Claim 4, line 45  Delete "at least one"
              Insert -- a material --

Column 10, Claim 6, line 52  Delete "of"
              Insert -- by --

Column 10, Claim 8, line 61  Delete "of"
              Insert -- by --

Signed and Sealed this
Third Day of March, 2015

Michelle K. Lee
*Deputy Director of the United States Patent and Trademark Office*